(12) United States Patent
Hopkins

(10) Patent No.: US 6,647,525 B1
(45) Date of Patent: Nov. 11, 2003

(54) ELECTRONICS TESTING CIRCUIT AND METHOD

(75) Inventor: Harland Glenn Hopkins, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 463 days.

(21) Appl. No.: 09/713,443

(22) Filed: Nov. 15, 2000

Related U.S. Application Data

(60) Provisional application No. 60/171,059, filed on Dec. 16, 1999.

(51) Int. Cl.[7] .......................... G01R 31/28; G06F 11/00
(52) U.S. Cl. ........................ 714/738; 714/728
(58) Field of Search ................ 714/724, 728, 714/738

(56) References Cited

U.S. PATENT DOCUMENTS 5,960,191 A * 9/1999 Sample et al. ............ 703/28
6,349,396 B2 * 2/2002 Akram ..................... 714/724
6,349,398 B1 * 2/2002 Resnick .................... 714/724
6,357,025 B1 * 3/2002 Tuttle ....................... 714/724

FOREIGN PATENT DOCUMENTS

EP 0642083 A1 * 3/1995 ........... G06F/11/26
WO WO 9932893 A1 * 7/1999 ........... G01R/31/00

* cited by examiner

Primary Examiner—R. Stephen Dildine
(74) Attorney, Agent, or Firm—Robert D. Marshall, Jr.; W. James Brady, III; Frederick J. Telecky, Jr.

(57) ABSTRACT

An electronics testing circuit comprises a tested circuit (12) which includes testing cells (30,32) and a first transceiver (54) coupled to the cells (30,32). The first transceiver (54) is operable to transmit signals received from the testing cells (30,32) and to receive signals transmitted for the cells (30,32). A second transceiver (26) is operable to receive signals from the first transceiver (54) and send signals to the first transceiver (54). A testing device (18) is coupled to the second transceiver (26) and is operable to send signals to it for the testing cells (30,32) and receive signals from the testing cells (30,32).

15 Claims, 2 Drawing Sheets

| EXT | TMS | 1 | 1 | 1 | 1 | 1 | 1 | 1 | 0 | 1 | 1 | 0 | 1 | 0 | 1 | 1 | 1 | 1 | 1 | 1 | 1 | 1 | 1 |
|---|---|---|---|---|---|---|---|---|---|---|---|---|---|---|---|---|---|---|---|---|---|---|---|
| | TDI | 0 | 0 | 0 | 1 | 0 | 1 | 1 | 0 | 1 | 1 | 1 | 1 | 1 | 1 | 1 | 1 | 1 | 0 | 1 | 0 | 1 | 0 |
| | TCK | 0 | 1 | 0 | 0 | 1 | 0 | 0 | 1 | 0 | 0 | 1 | 0 | 0 | 1 | 0 | 0 | 1 | 0 | 1 | 0 | 0 | 1 |
| TRANSMITTED | | 1 | 0 | | | | 0 | | | 1 | | | 0 | | | 0 | | | | | | | |
| INT | TMS | | | 1 | 1 | 1 | 1 | 1 | 1 | 1 | 1 | 1 | 1 | 1 | 1 | 1 | 1 | 1 | 1 | 1 | 1 | 1 | |
| | TDI | | | 0 | 0 | 0 | 0 | 0 | 0 | 0 | 0 | 0 | 0 | 0 | 0 | 0 | 0 | 1 | 1 | 1 | 0 | 0 | |
| | TCK | | | 1 | 1 | 0 | 1 | 1 | 0 | 1 | 1 | 0 | 1 | 1 | 0 | 1 | 1 | 0 | 1 | 1 | 0 | 1 | |
| | TDO | | | | | | | | | | | | | | | | | | | | | | | |
| TRANSMITTED | | | | | | | | | | | | | | | | | | | | | 0 | 0 | |
| EXT | TDO | | | | | | | | | | | | | | | | | | | | | | | 0 |

| EXT | TMS | 1 | 1 | 1 | 1 | 1 | 1 | 1 | 0 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|---|---|---|---|---|---|---|---|---|
| | TDI | 0 | 0 | 0 | 1 | 0 | 1 | 1 | 0 | 1 | 1 | 1 | 1 | 1 | 1 | 1 | 1 | 1 | 0 | 0 | 0 | 1 | 1 |
| | TCK | 0 | 1 | 0 | 0 | 1 | 0 | 0 | 1 | 0 | 0 | 1 | 0 | 0 | 1 | 0 | 0 | 1 | 0 | 0 | 0 | 0 | 1 |
| TRANSMITTED | | 1 | 0 | | | | 0 | | | 1 | | | 0 | | | 0 | | | | | | | |
| INT | TMS | | | 1 | 1 | 1 | 1 | 1 | 1 | 1 | 1 | 1 | 1 | 1 | 1 | 1 | 1 | 1 | 1 | 1 | 1 | 1 | |
| | TDI | | | 0 | 0 | 0 | 0 | 0 | 0 | 0 | 0 | 0 | 0 | 0 | 0 | 0 | 0 | 1 | 1 | 1 | 0 | 0 | |
| | TCK | | | 1 | 1 | 0 | 1 | 1 | 0 | 1 | 1 | 0 | 1 | 1 | 0 | 1 | 1 | 0 | 0 | 0 | 0 | 0 | |
| | TDO | | | | | | | | | | | | | | | 0 | | | | 1 | 1 | | | |
| TRANSMITTED | | | | | | | | | | | | | | | | | | | | | 0 | 1 | |
| EXT | TDO | | | | | | | | | | | | | | | | | | | | | | | 1 |

ELECTRONICS TESTING CIRCUIT AND METHOD

This application claims the benefit of provisional application No. 60/171,059 filed Dec. 16, 1999.

TECHNICAL FIELD OF THE INVENTION

This invention relates generally to the field of electronic devices, and more particularly to an electronics testing circuit and method.

BACKGROUND OF THE INVENTION

Electronic circuits may be tested to accomplish various functions. A circuit may be tested to determine whether there are physical defects. A circuit may also be tested to determine its response to certain inputs, a kind of testing that may be referred to as emulation. Testing is typically performed using IEEE standard 1149.1, also described as JTAG, which uses several pins on the circuit to send and receive signals during testing. Requiring pins for testing purposes may make those pins unavailable for non-testing functions. Circuits with fewer pins have fewer options to combine input and output needed for non-testing functions with support for testing and emulation under the JTAG standard.

SUMMARY OF THE INVENTION

Accordingly, a need has arisen in the art for an improved electronics testing system. The present invention provides an electronics testing circuit and method that substantially reduce or eliminate problems associated with prior electronic testing systems.

In accordance with the present invention, an electronics testing circuit comprises a tested circuit which includes testing cells and a first transceiver coupled to the cells. The first transceiver is operable to transmit signals received from the testing cells and to receive signals transmitted for the cells. A second transceiver is operable to receive signals from the first transceiver and send signals to the first transceiver. A testing device is coupled to the second transceiver and is operable to send signals to it for the testing cells and receive signals from the testing cells.

More specifically, in accordance with one embodiment of the present invention, the tested circuit may include a modulator and a demodulator. An additional pair of modulator and demodulator may be coupled between the second transceiver and the testing device. The modulators and demodulators are operable such that the transceivers transmit and receive the signals in modulated form.

Technical advantages of the present invention include providing an electronics testing circuit. In particular, the electronics circuit may allow communications between the testing cells in the tested circuit and a testing device without using the pins of the tested circuit. Accordingly, pins on the tested circuit are not dedicated to emulation, or more broadly, testing. As a result, the number of pins available for implementing consumer functionality is increased.

Other technical advantages of the present invention will be readily apparent to one skilled in the art from the following figures, descriptions, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
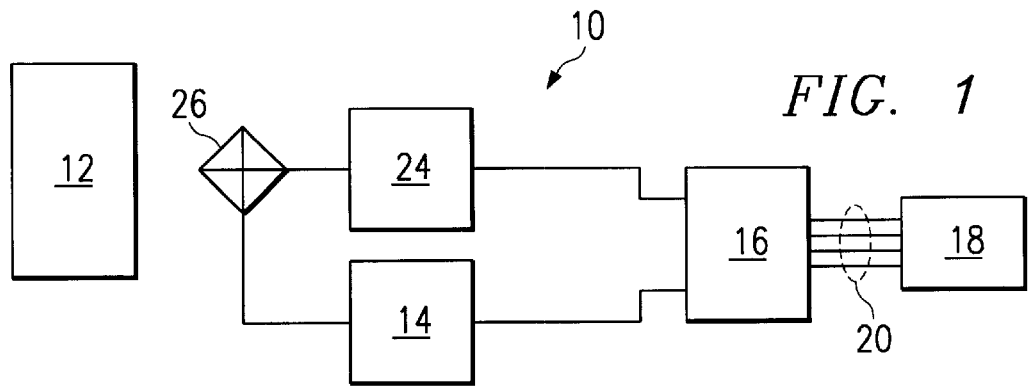
FIG. 1 is a block diagram illustrating an electronics testing circuit in accordance with one embodiment of the present invention.

The preferred embodiments of the present invention and its advantages are best understood by referring now in more detail to the FIGURES in which like numerals refer to like parts. FIG. 1 illustrates an electronics testing circuit in accordance with one embodiment of the present invention. As described in more detail below, the testing circuit may include a testing device which is configured to send multiple bit streams to a tested circuit. The multiple bit streams are combined so that they can be transmitted by electromagnetic waves. The tested circuit and testing device can then communicate without dedicating a pin of the tested circuit. Accordingly, more pins are available for use in improving the actual functionality of the tested circuit.

FIG. 1 is a block diagram illustrating an electronics testing circuit 10 for communicating signals between a standard testing device 18 and a tested circuit 12. The testing device may comprise any of the many devices that correspond to the JTAG or IEEE 1149.1 standard. For example, the Texas Instruments XDS510 emulator can be used. Testing can include both testing of physical connections in a circuit and testing of the responses of that circuit to specific inputs, often called emulation.

Referring to FIG. 1, the electronics testing circuit 10 comprises the testing device 18 and connections 20 between the testing device 18 and the translation circuit 16. The translation circuit 16 is more specifically shown in FIG. 3 as discussed below. The translation circuit 16 generally operates to combine the multiple bit stream signals received from a JTAG testing device into a single signal. A JTAG device may provide mode (TMS), input (TDI), and clock (TCK) signals. There are additional types of signals that may be provided by the testing device 18 depending on the JTAG device employed. Many signal processing techniques may be used to combine the signals. For example, each signals could be pulse code modulated (PCM) onto an analog signal. If the PCM analog signals have different frequency bands, they could be combined into one signal containing the information for each of the bit streams. Another example would be time multiplexing the bit streams into a single bit stream. It will be understood that the signal processing by which the multiple signals are combined may be other than PCM or time-multiplexing without departing from the scope of the present invention.

The translation circuit 16 is coupled to a modulator 24. The modulator 24 generates a signal modulated by the signal received from the translation circuit 16. It will be understood that the modulator 24 may be included inside the translation circuit 16 and that the translation circuit 16 may employ a signal processing technique to combine the signals received from the testing device 18 that make additional modulation unnecessary.

The modulator 24 is coupled to a transceiver 26. A transceiver is a device that is capable of sending and receiving electromagnetic waves. The transceiver 26 may have one antenna used for both sending and receiving, or two or more antennas. The transceiver 26 may also use array antennas. In order to reduce the risk of interference, the transceiver may use a frequency that is not a multiple of the clock frequency used by the tested circuit. The transceiver 26 receives a signal from modulator 24 and transmits it to the tested circuit 12. The tested circuit 12 is more fully specifically shown in FIG. 2. The transceiver 26 is also coupled to demodulator 14 which demodulates signals received by the transceiver 26 from the tested circuit 12. The demodulator 14 is coupled to the translation circuit 16 to which demodulated signals are sent. The translation circuit 16 may respond to the signal received from the tested circuit 12 by resetting its signal processing circuitry. In another embodiment, the demodulated signal may be provided directly to the testing device 18 from the demodulator 14. The testing device 18 receives the signal from the testing circuit 12 as if it were connected to a dedicated testing output pin on the tested circuit 12.

Figure 2:
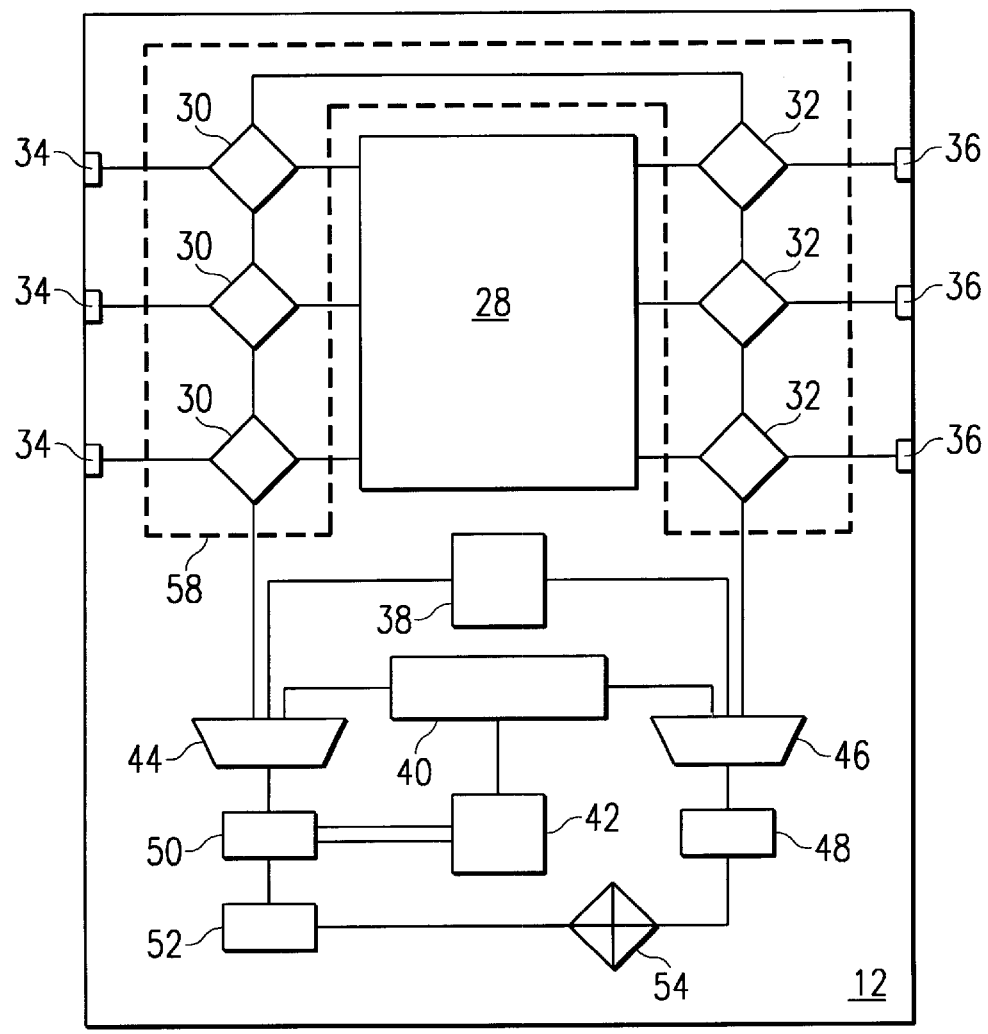
FIG. 2 is a block diagram illustrating a tested circuit in accordance with one embodiment of the present invention.

FIG. 2 is a block diagram illustrating the tested circuit 12. The tested circuit 12 comprises functional logic 28. The functional logic 28 may be one or more chips. The tested circuit 12 includes testing cells 30 coupled between the input pins 34 and the functional logic. Similarly, testing cells 32 are coupled between the output pins 36 and the functional logic. One-to-one correspondence between testing cells and pins is not necessary. For example, functional circuitry having 3-state or Input/Output pins, two or three testing cells may be necessary, while pins connected to ground or a set voltage may not require a testing cell. It will be understood that those variations are within the scope of the present invention.

The testing cells 30 can store values placed on their input pins 34, while passing those values on to the functional circuitry 28. The testing cells 32 can store value output from the functional circuitry 28, while passing those values to their output pins 36. All the testing cells 30,32 are connected to their neighbor or neighbors such that they define a shift register 58. The testing cells 30,32 are operable to pass their stored values along the shift register from the input splitter 44 to the output receiver 46. The testing cells 30 are also operable to pass their stored values to the functional logic 28 rather than the values on the input pins 34.

The tested circuit 12 includes a transceiver 54 which may have one antenna used for both sending and receiving, two or more antennas, and may also use array antennas. The transceiver 54 is coupled to a demodulator 52 which demodulates the signal sent from the testing device 18. The demodulator is coupled to a translation circuit 50. The translation circuit 50, in one embodiment, is a demultiplexer which inverts the signal processing performed in translation circuit 16. Thus the single signal is broken into multiple signals, for example TMS, TDI, and TCK. Translation circuit 50 passes the TDI signal to the input splitter 44 and the TMS and TCK signals to the controller 42.

The controller 42 is coupled to the instruction register 40. The controller 42 determines which circuit element will receive the TDI signal. The input splitter 44 is coupled to the first testing cell 30 of the shift register 58, the instruction register 40, and the bypass latch 38. The controller 42 determines whether the instruction register 40 updates its current instruction with the TDI. The instruction register 40, in response to its current instruction, determines whether the bypass latch 38 or the testing cells 30,32 will respond to the TDI. For example, the instruction register 40 may contain an instruction which activates the first testing cell 30 in the shift register 58 to replace its stored value with TDI, and communicate its old stored value to the next testing cell in the shift register 58. Each of the other testing cells 30,32 would like receive a new stored value while passing the old stored value to the next testing cell 30,32. The last testing cell 32 would pass its stored value to the output receiver 46 as the TDO signal. Similarly, the bypass latch 38 can receive TDI while outputting TDO to the output receiver 46. The output receiver 46 is coupled to a modulator 48 which modulates the TDO signal and transmits it to the transceiver 54 for transmission to transceiver 26.

The tested circuit 12 can function normally when the instruction in the instruction register 40 directs the testing cells 30,32 to pass values between the pins 34,36 and the functional logic 28. This activity can be monitored by storing values in the testing cells 30,32 and moving those values though the shift register 58 to the output receiver 46, without disturbing the pass-through functionality of the testing cells 30,32. Physical defects can be detected by directing testing cells 32 to place a stored value on the output pin 36 and storing the received value in the testing cell 30 coupled to the input pin or, if the output pin 36 is free, measuring it directly. Emulation can be performed by directing testing cells 30 to load stored values into the functional circuitry while monitoring the output at testing cells 32.

Figures 3, 4, 5:
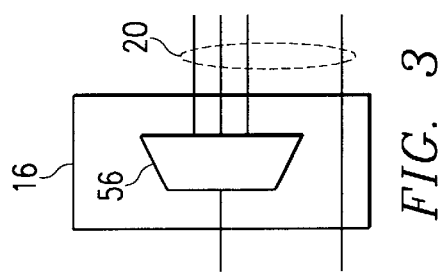
FIG. 3 is a block diagram illustrating a translation circuit in accordance with one embodiment of the present invention.
FIG. 4 is a signal flow diagram illustrating signals transmitted in an electronics testing circuit in accordance with one embodiment of the present invention.
FIG. 5 is a signal flow diagram illustrating signals transmitted in an electronics testing circuit in accordance with one embodiment of the present invention.

FIG. 3 illustrates a block diagram of one embodiment of translation circuit 16. In that embodiment three signals are received from the testing device 18. Each signal is a bit stream. The signals are combined into one bit stream using time division multiplexing. See FIGS. 4 and 5 for signal charts showing time division multiplexing. The single signal is output to modulator 24. In this embodiment, the signal received from the tested circuit 12 is passed through to the testing device 18 without modification.

FIG. 4 illustrates signals transmitted in an electronics testing circuit 10. In this FIGURE "ext" signifies external of the translation circuit 16, while "int" signifies internal of translator circuit 50. The testing device 18 places three separate signals TMS, TDI, and TCK onto some of connections 20. The signals are combined by the translation circuit 16, modulated by modulator 24 and electromagnetically transmitted by transceiver 26 in that form. They are received, demodulated, and separated into separate signals on the tested circuit. Under the JTAG protocol, TMS and TDI signals are sampled on the rising edge (from 0 to 1) of the TCK signal. The TDO signal is provided at the falling edge (from 1 to 0) of the TCK signal. The tested circuit responds to the TMS, TDI, and TCK signals and produces a TDO signal. The TDO signal is then modulated, transmitted, demodulated, and received by the testing device. In this embodiment, the testing device waits to receive the TDO signal before formulating the next set of TMS, TDI, and TCK signals. In FIG. 5 a different testing device operation is depicted. In that FIGURE the testing device does not wait for the TDO signal before sending out additional TMS, TDI, and TCK signals.

Although the present invention has been described with several embodiments, various changes and modifications may be suggested to one skilled in the art. It is intended that the present invention encompass such changes and modifications as fall within the scope of the appended claims.

What is claimed is:

1. An electronics testing circuit, comprising:
   a tested circuit including testing cells and a first transceiver coupled to the cells, the first transceiver operable to transmit signals received from the testing cells and to receive signals transmitted for the cells;

a second transceiver operable to receive signals from the first transceiver and send signals to the first transceiver;

a testing device coupled to said second transceiver and operable to send signals to the second transceiver for the testing cells and receive signals from the testing cells;

a translation circuit coupled between the testing circuit and the second transceiver, the translation circuit including a multiplexer, and wherein the signals sent from the testing device are multiple and the multiplexer is operable to generate a single signal from the multiple signals, and the tested circuit includes a demultiplexer operable to generate the multiple signals sent from the testing device from the single signal.

2. The circuit of claim 1 further comprising:

a first modulator coupled to the second transceiver and the testing device, and operable to generate a first modulated signal from signals received from the testing device; and a first demodulator, and wherein the tested circuit includes a second modulator and a second demodulator, the second modulator operable to generate a second modulated signal from signals received from the testing cells, the second demodulator operable to generate a first demodulated signal from the first modulated signal, and the first demodulator is operable to generate a second demodulated signal from the second modulated signal, and the first and second transceivers transmit and receive signals in modulated form.

3. The circuit of claim 1 wherein the multiplexer is a time multiplexer and the multiple signals are multiple bit streams and the single signal is a first bit stream.

4. The circuit of claim 3 wherein the translation circuit receives signals from the testing cells, the signals from the testing cells are a second bit stream and the translation circuit transmits the second bit stream to the testing device.

5. An electronics testing circuit, comprising:

a tested circuit including input pins, output pins, testing cells and a first transceiver coupled to the cells, the first transceiver operable to transmit signals received from the testing cells and to receive signals transmitted for the cells, each pin corresponding to at least one testing cell;

a second transceiver operable to receive signals from the first transceiver and send signals to the first transceiver;

a testing device coupled to said second transceiver and operable to send signals representing emulation inputs to the second transceiver for the testing cells and receive signals from the testing cells;

a first modulator coupled to the second transceiver and the testing device, and operable to generate a first modulated signal from signals received from the testing device; and a first demodulator;

the tested circuit further includes a second modulator and a second demodulator, the second modulator operable to generate a second modulated signal from signals received from the testing cells, the second demodulator operable to generate a first demodulated signal from the first modulated signal, and the first demodulator is operable to generate a second demodulated signal from the second modulated signal, and the first and second transceivers transmit and receive signals in modulated form.

6. An electronics testing circuit, comprising:

a tested circuit including input pins, output pins, testing cells and a first transceiver coupled to the cells, the first transceiver operable to transmit signals received from the testing cells and to receive signals transmitted for the cells, each pin corresponding to at least one testing cell, the testing cells being coupled together and operable to function as a shift register;

a second transceiver operable to receive signals from the first transceiver and send signals to the first transceiver;

a testing device coupled to said second transceiver and operable to send signals to the second transceiver for the testing cells and receive signals from the testing cells;

a first modulator coupled to the second transceiver and the testing device, and operable to generate a first modulated signal from signals received from the testing device; and a first demodulator;

the tested circuit further includes a second modulator and a second demodulator, the second modulator operable to generate a second modulated signal from signals received from the testing cells, the second demodulator operable to generate a first demodulated signal from the first modulated signal, and the first demodulator is operable to generate a second demodulated signal from the second modulated signal, and the first and second transceivers transmit and receive signals in modulated form.

7. The circuit of claim 6 wherein the signals received from the cells are the signals received from an end cell of the shift register.

8. A method of testing a circuit, comprising the steps of:

generating testing cell signals;

electromagnetically transmitting the testing cell signals from the circuit to a transceiver;

transmitting the testing cell signals from the transceiver to a testing device;

transmitting testing device signals from the testing device to a transceiver;

electromagnetically transmitting the testing device signals to the circuit; and controlling the testing cells in response to the testing device signals.

9. The method of claim 8 further comprising the steps of:

modulating the testing cell signals before the step of electromagnetically transmitting them;

demodulating the testing cell signals before the step of transmitting them to the testing device;

modulating the testing device signals before the step of electromagnetically transmitting them; and demodulating the testing device signals before the step of controlling the testing cells in response to them.

10. The method of claim 8 wherein the testing device signals include multiple bit streams and further comprising the step of:

combining the multiple bit streams into a single bit stream before the step of electromagnetically transmitting the testing device signals.

11. The method of claim 8 wherein the testing device signals include emulation signals.

12. The method of claim 11 wherein the step of controlling the testing cells includes storing emulation signals in a first set of testing cells coupled to at least one of the inputs of the functional logic.

13. The method of claim 12 further comprising the steps of:

applying the emulation signals stored in the first set of testing cells to the corresponding inputs of the functional logic; and storing output signals in a second set of testing cells coupled to at least one of the outputs of the functional logic.

14. The method of claim 8 further comprising the steps of:

storing input signals applied to the functional logic in a first set of testing cells;

storing output signals produced by the functional logic in a second set of testing cells; and wherein the testing cell signals are generated from the input and output signals.

15. The method of claim 8 wherein the step of generating testing cell signals includes operating the testing cells as a shift register.

\* \* \* \* \*